United States Patent
Yoon et al.

(10) Patent No.: US 8,916,949 B2
(45) Date of Patent: Dec. 23, 2014

(54) RESISTIVE MEMORY DEVICE AND METHOD FOR MANUFACTURING THE SAME

(71) Applicant: SK Hynix Inc., Gyeonggi-do (KR)

(72) Inventors: Hyo Seob Yoon, Gyeonggi-do (KR); Han Woo Cho, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 27 days.

(21) Appl. No.: 13/718,817

(22) Filed: Dec. 18, 2012

(65) Prior Publication Data

US 2014/0061571 A1  Mar. 6, 2014

(30) Foreign Application Priority Data

Aug. 29, 2012  (KR) .................. 10-2012-0094702

(51) Int. Cl.
*H01L 31/058* (2006.01)
*H01L 45/00* (2006.01)
*H01L 27/24* (2006.01)

(52) U.S. Cl.
CPC .......... *H01L 45/128* (2013.01); *H01L 45/1233* (2013.01); *H01L 45/1683* (2013.01); *H01L 27/2409* (2013.01); *H01L 45/126* (2013.01); *H01L 45/14* (2013.01); *H01L 45/16* (2013.01); *H01L 45/065* (2013.01)
USPC ........ 257/467; 257/1; 257/536; 257/E45.001; 257/E45.002; 438/55

(58) Field of Classification Search
USPC ......... 257/1, 2, 3, 4, 5, 42, 43, 467, 536, 537, 257/E45.001, E45.002; 438/55, 900
See application file for complete search history.

(56) References Cited

U.S. PATENT DOCUMENTS

| 4,283,233 A | 8/1981 | Goldstein et al. |
| 2010/0078615 A1* | 4/2010 | Ito ..................................... 257/2 |
| 2012/0149166 A1* | 6/2012 | Park et al. ..................... 438/382 |

FOREIGN PATENT DOCUMENTS

KR  100834829  6/2008

* cited by examiner

*Primary Examiner* — Eduardo A Rodela
(74) *Attorney, Agent, or Firm* — IP & T Group LLP

(57) ABSTRACT

A resistive memory device and a method for manufacturing the same are provided. The resistive memory device includes a lower electrode, a variable resistive layer formed on the lower electrode and configured so that the volume thereof is contracted or expanded according to temperature, and an upper electrode formed on the variable resistive layer. At least a portion of the lower electrode is configured to be electrically connected to the upper electrode.

14 Claims, 4 Drawing Sheets

RESISTIVE MEMORY DEVICE AND METHOD FOR MANUFACTURING THE SAME

CROSS-REFERENCES TO RELATED APPLICATION

This application claims priority under 35 U.S.C. 119(a) to Korean application number 10-2012-0094702, filed on Aug. 29, 2012, in the Korean Patent Office, which is incorporated by reference in its entirety.

BACKGROUND OF THE INVENTION

1. Technical Field

The inventive concept relates to a next-generation memory device and a method for manufacturing the same, and more particularly, to a resistive memory device and a method for manufacturing the same.

2. Related Art

Non-volatile memory devices have a data retention characteristic, in which data stored therein are not erased even when power is shut down. Therefore, the nonvolatile memory devices have been widely applied to computers, mobile telecommunication systems, memory cards, and the like.

As the non-volatile memory devices, flash memory devices have been typically widely used. The flash memory devices mainly employ memory cells having a stacked gate structure. The flash memory devices need improve film quality of a tunnel oxide layer and increase a coupling ratio of the cell so as to enhance rove reliability and program efficiency of the flash memory cell.

Currently, new next-generation memory devices, for example, phase-change random access memory devices (PRAMs), magnetoresistive random access memory devices (MRAMs), resistive random access memory devices (ReRAMs), and the like have been proposed other than the flash memory devices.

While the proposed next-generation memory devices theoretically have device characteristics, they are difficult to ensure stable characteristics on a large-diameter wafer.

In particular, the PRAMs have very high development completeness, but it is difficult to fabricate the PRAMS due to instability and variable material property of the phase-change material. The MRAMs utilize copper metal layer that is not easily etched, so it is difficult to fabricate the MRAMs. Further, the ReRAMs have inaccurate driving mechanism and thus may not ensure reliability.

SUMMARY

According to one aspect of an exemplary embodiment, a resistive memory device may include a lower electrode; a variable resistive layer formed over the lower electrode and configured so that the volume thereof is contracted or expanded according to temperature; and an upper electrode formed over the variable resistive layer, wherein at least a portion of the lower electrode is configured to be electrically connected to the upper electrode.

According to another one aspect of exemplary embodiment, a resistive memory device may include an interlayer insulating layer formed over a semiconductor substrate, in which a space for forming a variable resistive layer is defined; a switching device disposed in the space for forming the variable resistive layer; a cylinder type lower electrode formed on the switching device in the space for forming the variable resistive layer; a shape-memory alloy layer buried in the space for forming the variable resistive layer, surrounded by the cylinder type lower electrode; and an upper electrode formed on the shape-memory alloy layer, wherein the upper electrode is configured to be in contact with at least a portion of the cylinder type lower electrode.

According to still another one aspect of exemplary embodiment, a method for manufacturing a resistive memory device may include forming a lower electrode on a semiconductor substrate; forming a shape-memory alloy layer on the lower electrode; and forming an upper electrode on the shape-memory alloy layer to be in contact with at least a portion of the lower electrode.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1A:
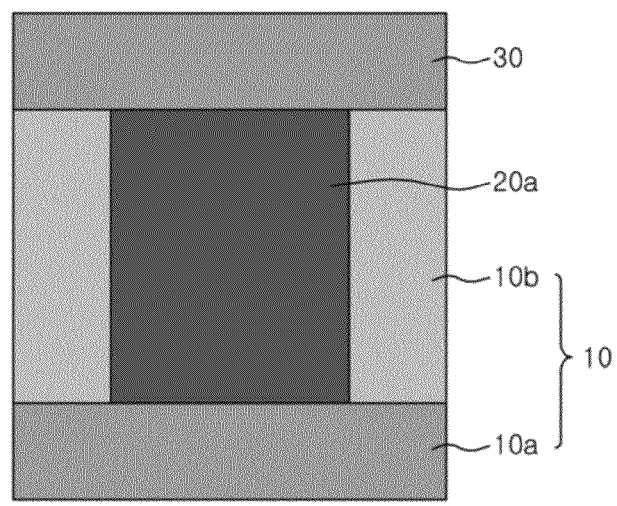
FIGS. 1A and 1B are cross-sectional views schematically illustrating a resistive memory device according to an exemplary embodiment of the inventive concept.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

Figure 1B:
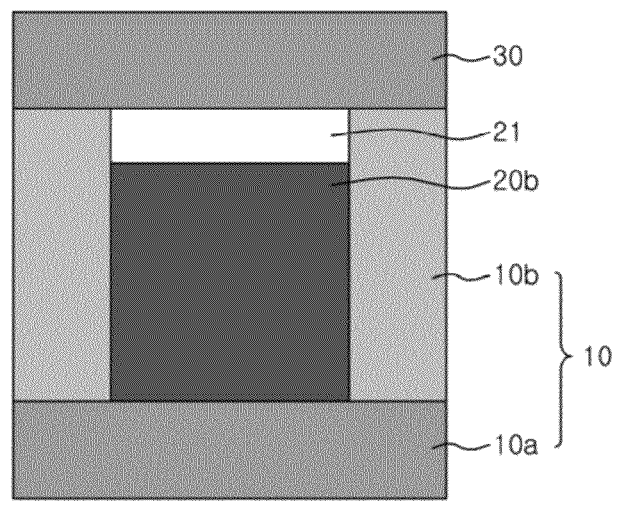

FIGS. 1A and 1B are cross-sectional views schematically illustrating a resistive memory device according to an exemplary embodiment of the inventive concept.

Referring to FIGS. 1A and 1B, a resistive memory device may include a lower electrode 10, a shape-memory alloy layer 20a or 20b, and an upper electrode 30. The resistive memory device may further include a void 21. In particular, the shape-memory alloy layer 20a of FIG. 1A illustrates an expansion phase, and the shape-memory alloy layer 20b of FIG. 1B illustrates a contraction phase.

The lower electrode 10 may include a bottom portion 10a connected to a switching device (not shown), and a sidewall portion 10b disposed on the bottom portion 10a and extending from an edge of the bottom portion 10a toward the upper electrode 30. In other words, the lower electrode 10 is configured substantially in a cylinder shape with a bottom, thereby opened to define a confined space for forming the variable resistive layer.

The shape-memory alloy layer 20a and 20b may be buried in the space for forming the variable resistive layer. Each of the shape-memory alloy layer 20a and 20b may include a nitinol-based alloy including titanium-nickel (Ti—Ni), titanium-nickel-hafnium (Ti—Ni—Hf), titanium-nickel-zirconium (Ti—Ni—Zr), titanium-nickel-palladium (Ti—Ni—Pd), or titanium-nickel-platinum (Pt), or a Cu-based alloy including copper (Cu)-aluminum (Al-nickel (Ni) or copper (Cu)-zinc (Zn)-nickel (Ni).

The upper electrode 30 may be formed on the sidewall portion 10b of the lower electrode 10 and the shape-memory alloy layer 20a to be electrically connected to the sidewall portion 10b.

As well-known in the art, the shape-memory alloy layer have a property that the volume thereof is changed depending on temperature. In other words, the shape-memory alloy layer 20a and 20b have a Martensite phase (like 20b) as a low-temperature phase in which the volume thereof is contracted and an Austenite phase (like 20a) as a high-temperature phase in which the volume thereof is expanded.

Figure 2A:
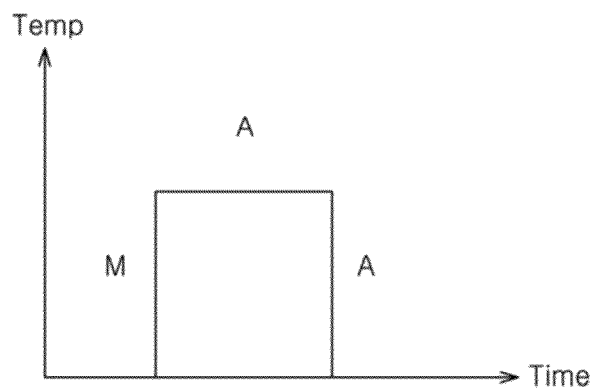
FIGS. 2A and 2B are views explaining driving of a resistive memory device according to an exemplary embodiment of the inventive concept.
Figure 2B:
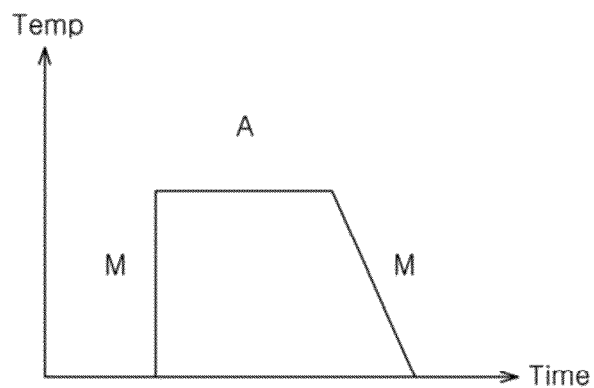

Therefore, as shown in FIGS. 2A and 2B, the shape-memory alloy layer 20a and 20b has a Martensite phase M as a contraction phase (like 20b) before heating and has an Austenite phase A as an expansion phase (like 20a) when the temperature of the shape-memory alloy layer 20a and 20b is increased through heating by the lower electrode 10. At this time, the heating period of the first shape-memory alloy layer 20a and 20b may be a period corresponding to a temperature range in which the first shape-memory alloy layer 20a and 20b is phase-changed.

When the shape-memory alloy layer 20a is then rapidly cooled as shown in FIG. 2A, the shape-memory alloy layer 20a is continuously maintained in the Austenite phase A, and the lower electrode 10 and the upper electrode 30 are connected by the shape-memory alloy layer 20a. Therefore, a resistance value of the space for forming the variable resistive layer becomes a resistance value of the shape-memory alloy layers 20a, and the memory device is in a low-resistance state, that is, in a set state.

On the other hand, when the shape-memory alloy layer 20a is slowly cooled as shown in FIG. 2B, the shape-memory alloy layer 20a returns to the original Martensite M phase during the slow cooling process. Therefore, the void 21 is formed between the lower electrode 10 and the upper electrode 30 by contraction of the shape-memory alloy layer 20b. A resistance value of the variable resistive layer formation space becomes a sum of a resistance value of the shape-memory alloy layer 20b and a resistance value of the void 21. As well-known in the art, since air has a larger resistance value than the shape-memory alloy layer, the memory device is in a high-resistance state, that is, in a reset state.

In this exemplary embodiment, the lower electrode 10 is configured so that at least a portion of the lower electrode 10 is electrically connected to the upper electrode 30. If the lower electrode 10 is not intentionally connected to the upper electrode 30, open-circuit is caused in the memory cell when the shape-memory alloy layer 20b is contracted, because the shape-memory alloy layer 20b is spaced from the upper electrode 30 when the shape-memory alloy layer 20b is contracted while the shape-memory alloy layer 20a is in contact with the upper electrode 30 when the shape-memory alloy layer 20a is expanded. Therefore, the lower electrode 10 is configured in a spacer type or in a cylinder type to connect the upper electrode 30 and the lower electrode 10. However, the structure of the lower electrode 10 is not limited thereto and the lower electrode 10 may have any structure in which at least a portion thereof is connected to the upper electrode 30.

The shape-memory alloy causes the resistance value of the space for forming the variable resistive layer to be changed by contraction and expansion thereof depending on temperature so that new memory device may be implemented. The shape-memory alloy may be shape-changed bi-directionally and applied to various fields currently and therefore the memory device is stable in terms of fabrication and reliability as compared with existing memory devices.

FIGS. 3A to 3D are cross-sectional views illustrating a method for fabricating a resistive memory device according to an exemplary embodiment of the inventive concept.

Figure 3A:
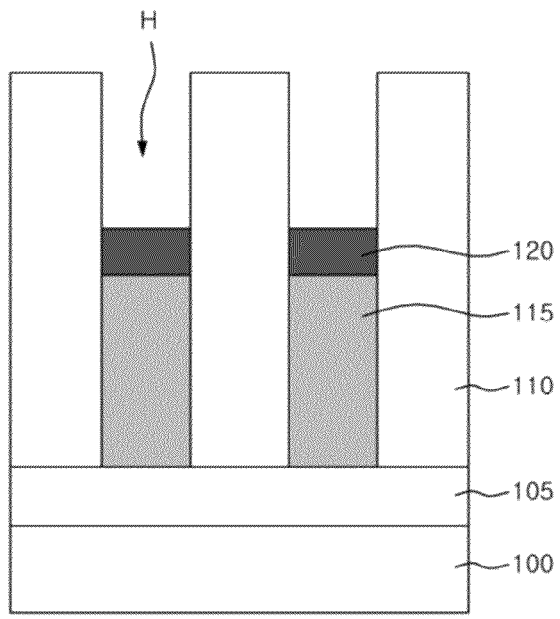
FIGS. 3A to 3D are cross-sectional views illustrating a method for manufacturing a resistive memory device according to an exemplary embodiment of the inventive concept.

Referring to FIG. 3A, an interlayer insulating layer 110 is formed on a semiconductor substrate 100. The semiconductor substrate 100 may include a junction type word line 105 formed therein or a metal word line 105 formed thereon. A portion of the interlayer insulating layer 110 is etched to form a contact hole H. A diode 115 is formed in a lower portion of the contact hole H and a bottom portion 120 for a lower electrode is formed on the diode 115. The diode 115 may be configured of a PN diode or a shottky diode according to the type of the word line 105. The bottom portion 120 may include a conductive material layer. Further, the interlayer insulating layer 110 may be configured of a single layer or multiple layers. The interlayer insulating layer 110 may be formed to have a height larger than a sum of heights of the diode 115 and the bottom portion 120 so that a space for forming the variable resistive layer is formed.

Figure 3B:
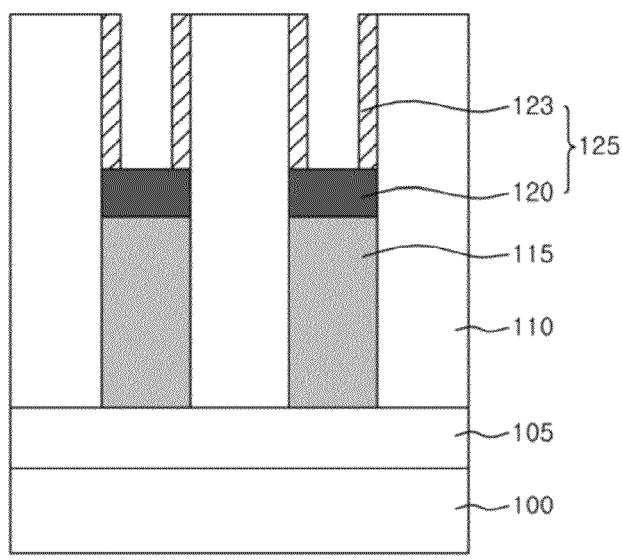

Referring to FIG. 3B, a conductive material layer is deposited on the bottom portion 120 and then anisotropically etched to form a cylinder type sidewall portion 123 for a lower electrode on the bottom portion 120. In some cases, the sidewall portion 123 may be configured in a spacer type. Therefore, the lower electrode 125 including the bottom portion 120 and the sidewall portion 123 is formed in the space for forming the variable resistive layer.

Figure 3C:
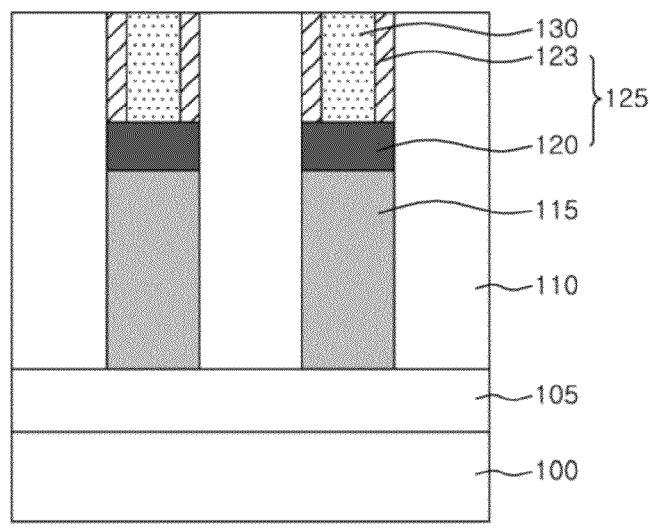

Referring to FIG. 3C, in order to form a variable resistive layer 130, a shape-memory alloy material is buried in the space for forming the variable resistive layer and then planarized to expose a top surface of the sidewall portion 123. At this time, the shape-memory alloy material may include a nitinol-based alloy such as Ti—Ni, Ti—Ni—Hf, Ti—Ni—Zr, Ti—Ni—Pd, or Ti—Ni—Pt, or a Cu-based alloy such as Cu—Al—Ni or Cu—Zn—Ni.

Figure 3D:
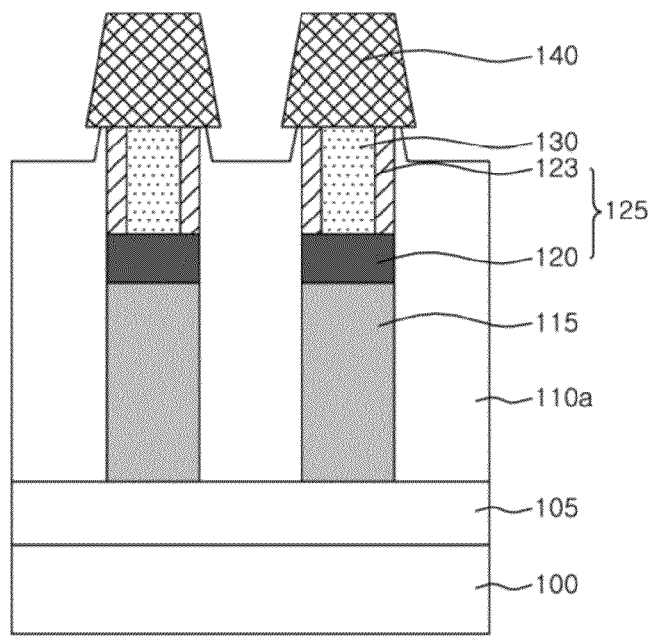

Referring to FIG. 3D, a conductive material layer is deposited on the resulting structure of FIG. 3C in which the variable resistive layer 130 is formed and then patterned to form an upper electrode 140 covering the variable resistive layer 130 and the exposed top surface of the sidewall portion 123. The interlayer insulating layer 110 exposed by the upper electrode 140 is recessed by a predetermined thickness to reduce disturbance, thereby forming the recessed interlayer insulating layer 110a.

As described above, according to the exemplary embodiments of the inventive concept, the shape-memory alloy layer is used as a variable resistive material to realize a memory operation by contraction and expansion of the shape-memory alloy layer depending on temperature.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A resistive memory device, comprising:
   a lower electrode;
   a variable resistive layer formed over the lower electrode and configured such that volume of itself is contracted or expanded according to temperature, and configured such that an upper surface of the variable resistive layer is spaced from the upper electrode according to the temperature; and
   an upper electrode formed over the variable resistive layer, wherein at least a portion of the lower electrode is configured to be electrically connected to the upper electrode.

2. The resistive memory device of claim 1, wherein the variable resistive layer is configured such that an upper surface thereof is in contact with the upper electrode according to the temperature.

3. The resistive memory device of claim 1, wherein the lower electrode includes a bottom portion and a cylinder type sidewall portion formed on the bottom portion, to define a space for forming a variable resistive layer.

4. The resistive memory device of claim 3, wherein the variable resistive layer is configured to be buried in the space for forming the variable resistive layer.

5. The resistive memory device of claim 1, wherein the variable resistive layer includes a material with means to be maintained in an expanded state when the variable resistive layer is rapidly cooled after expanded by the lower electrode or a material with means to be returned to a contracted state when the heated variable resistive layer is slowly cooled.

6. The resistive memory device of claim 5, wherein the variable resistive layer comprises a nitinol-based alloy including titanium-nickel (Ti—Ni), titanium-nickel-hafnium (Ti—Ni—Hf), titanium-nickel-zirconium (Ti—Ni), titanium-nickel-palladium (Ti—Ni—Pd), or titanium-nickel-platinum (Ti—Ni—Pt), or a Cu-based alloy including copper-aluminum-nickel (Cu—Al—Ni) or copper-zinc-nickel (Cu—Zn—Ni).

7. The resistive memory device of claim 5, wherein the resistive memory device is configured to be in a set state when the variable resistive layer is expanded, or in a reset state when the variable resistive layer is contracted.

8. A resistive memory device, comprising:
   an interlayer insulating layer formed over a semiconductor substrate, in which a space for forming a variable resistive layer is defined;
   a switching device disposed in the space for forming the variable resistive layer;
   a cylinder type lower electrode formed on the switching device in the space for forming the variable resistive layer;
   a shape-memory alloy layer buried in the space for forming the variable resistive layer, surrounded by the cylinder type lower electrode, and configured such that an upper surface of the variable resistive layer is spaced from the upper electrode according to the temperature; and
   an upper electrode formed on the shape-memory alloy layer,
   wherein the upper electrode is configured to be in contact with at least a portion of the cylinder type lower electrode.

9. The resistive memory device of claim 8, wherein the shape-memory alloy layer includes a material with means to be maintained in an expanded state when the shape-memory alloy layer is rapidly cooled after expanded by the cylinder type lower electrode or a material with means to be returned returns to a contracted state when the heated shape-memory alloy layer is slowly cooled.

10. The resistive memory device of claim 8, wherein the shape-memory alloy layer comprises a nitinol-based alloy including titanium-nickel (Ti—Ni), titanium-nickel-hafnium (Ti—Ni—Hf), titanium-nickel-zirconium (Ti—Ni—Zr), titanium-nickel-palladium (Ti—Ni—Pd), or titanium-nickel-platinum (Ti—Ni—Pt), or a Cu-based alloy including copper-aluminum-nickel (Cu—Al—Ni) or copper-zinc-nickel (Cu—Zn—Ni).

11. The resistive memory device of claim 8, wherein the resistive memory device is configured to be in a set state when the shape-memory alloy layer is expanded, or in a reset state when the shape-memory alloy layer is contracted.

12. A method for manufacturing a resistive memory device, the method comprising:
   forming a lower electrode on a semiconductor substrate;
   forming a shape-memory alloy layer on the lower electrode; and
   forming an upper electrode on the shape-memory alloy layer to be in contact with at least a portion of the lower electrode,
   wherein the shape-memory alloy layer is configured to such that an upper surface of the variable resistive layer is spaced from the upper electrode according to the temperature.

13. The method of claim 12, wherein the forming of a lower electrode includes:
   forming a pattern type bottom portion over the semiconductor substrate; and
   forming a cylinder type sidewall portion on the pattern type bottom portion.

14. The method of claim 13, wherein the shape-memory alloy layer is formed to be buried in a space surrounded by the pattern type bottom portion and the cylinder type sidewall portion.

* * * * *